United States Patent
Hwang et al.

(10) Patent No.: US 9,524,945 B2
(45) Date of Patent: Dec. 20, 2016

(54) CU PILLAR BUMP WITH L-SHAPED NON-METAL SIDEWALL PROTECTION STRUCTURE

(75) Inventors: Chien Ling Hwang, Hsinchu (TW); Yi-Wen Wu, Xizhi (TW); Chung-Shi Liu, Shinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1723 days.

(21) Appl. No.: 12/781,987

(22) Filed: May 18, 2010

(65) Prior Publication Data

US 2011/0285011 A1 Nov. 24, 2011

(51) Int. Cl.
*H01L 23/488* (2006.01)
*H01L 23/00* (2006.01)

(52) U.S. Cl.
CPC ............... *H01L 24/13* (2013.01); *H01L 24/11* (2013.01); *H01L 24/05* (2013.01); *H01L 24/16* (2013.01); *H01L 24/81* (2013.01); *H01L 2224/0345* (2013.01); *H01L 2224/0401* (2013.01); *H01L 2224/05611* (2013.01); *H01L 2224/05639* (2013.01); *H01L 2224/05644* (2013.01); *H01L 2224/05647* (2013.01); *H01L 2224/05671* (2013.01); *H01L 2224/1145* (2013.01); *H01L 2224/11452* (2013.01); *H01L 2224/11462* (2013.01); *H01L 2224/11464* (2013.01); *H01L 2224/11622* (2013.01); *H01L 2224/11849* (2013.01); *H01L 2224/1308* (2013.01); *H01L 2224/1357* (2013.01); *H01L 2224/1369* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01);
(Continued)

(58) Field of Classification Search
CPC ............. H01L 23/488; H01L 23/49838; H01L 23/49811; H01L 24/01; H01L 24/04–24/10
See application file for complete search history.

(56) References Cited

U.S. PATENT DOCUMENTS

| 3,528,090 A | 9/1970 | Van Laer |
| 4,380,867 A | 4/1983 | Antson |

(Continued)

FOREIGN PATENT DOCUMENTS

| CN | 101436559 | 5/2009 |
| JP | 5-267303 | 10/1993 |

(Continued)

OTHER PUBLICATIONS

Office Action from corresponding application No. CN 201010529468.1.
(Continued)

*Primary Examiner* — Jae Lee
(74) *Attorney, Agent, or Firm* — Hauptman Ham, LLP

(57) ABSTRACT

An L-shaped sidewall protection process is used for Cu pillar bump technology. The L-shaped sidewall protection structure is formed of at least one of non-metal material layers, for example a dielectric material layer, a polymer material layer or combinations thereof.

20 Claims, 13 Drawing Sheets

(52) U.S. Cl.
CPC ............ *H01L 2224/13181* (2013.01); *H01L 2224/13552* (2013.01); *H01L 2224/13565* (2013.01); *H01L 2224/13575* (2013.01); *H01L 2224/16145* (2013.01); *H01L 2224/16225* (2013.01); *H01L 2224/16227* (2013.01); *H01L 2224/814* (2013.01); *H01L 2224/81193* (2013.01); *H01L 2224/81447* (2013.01); *H01L 2224/81815* (2013.01); *H01L 2924/0103* (2013.01); *H01L 2924/0104* (2013.01); *H01L 2924/014* (2013.01); *H01L 2924/01006* (2013.01); *H01L 2924/01012* (2013.01); *H01L 2924/01013* (2013.01); *H01L 2924/01019* (2013.01); *H01L 2924/01023* (2013.01); *H01L 2924/01024* (2013.01); *H01L 2924/01025* (2013.01); *H01L 2924/01029* (2013.01); *H01L 2924/01032* (2013.01); *H01L 2924/01033* (2013.01); *H01L 2924/01038* (2013.01); *H01L 2924/01047* (2013.01); *H01L 2924/01049* (2013.01); *H01L 2924/01073* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/1305* (2013.01); *H01L 2924/1306* (2013.01); *H01L 2924/13091* (2013.01); *H01L 2924/14* (2013.01); *H01L 2924/1421* (2013.01); *H01L 2924/1431* (2013.01); *H01L 2924/1437* (2013.01)

(56) References Cited

U.S. PATENT DOCUMENTS

| | | | |
|---|---|---|---|
| 4,720,740 | A | 1/1988 | Clements et al. |
| 4,811,082 | A | 3/1989 | Jacobs et al. |
| 4,990,462 | A | 2/1991 | Sliwa, Jr. |
| 5,075,253 | A | 12/1991 | Sliwa, Jr. |
| 5,134,460 | A | 7/1992 | Brady et al. |
| 5,380,681 | A | 1/1995 | Hsu |
| 5,391,917 | A | 2/1995 | Gilmour et al. |
| 5,448,114 | A | 9/1995 | Kondoh et al. |
| 5,466,635 | A | 11/1995 | Lynch et al. |
| 5,481,133 | A | 1/1996 | Hsu |
| 5,510,298 | A | 4/1996 | Redwine |
| 5,747,881 | A | 5/1998 | Hosomi et al. |
| 5,767,001 | A | 6/1998 | Bertagnolli et al. |
| 5,998,292 | A | 12/1999 | Black et al. |
| 6,002,177 | A | 12/1999 | Gaynes et al. |
| 6,184,060 | B1 | 2/2001 | Siniaguine |
| 6,187,678 | B1 | 2/2001 | Gaynes et al. |
| 6,191,493 | B1 | 2/2001 | Yasunaga et al. |
| 6,218,281 | B1 | 4/2001 | Watanabe et al. |
| 6,229,216 | B1 | 5/2001 | Ma et al. |
| 6,229,220 | B1 | 5/2001 | Saitoh et al. |
| 6,232,563 | B1 | 5/2001 | Kim et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,322,903 | B1 | 11/2001 | Siniaguine et al. |
| 6,355,501 | B1 | 3/2002 | Fung et al. |
| 6,426,556 | B1 | 7/2002 | Lin |
| 6,434,016 | B2 | 8/2002 | Zeng et al. |
| 6,448,168 | B1 | 9/2002 | Rao et al. |
| 6,448,661 | B1 | 9/2002 | Kim et al. |
| 6,464,895 | B2 | 10/2002 | Forat et al. |
| 6,465,892 | B1 | 10/2002 | Suga |
| 6,472,293 | B1 | 10/2002 | Suga |
| 6,489,229 | B1 * | 12/2002 | Sheridan et al. ............. 438/614 |
| 6,492,198 | B2 | 12/2002 | Hwang |
| 6,538,333 | B2 | 3/2003 | Kong |
| 6,562,653 | B1 | 5/2003 | Ma et al. |
| 6,570,248 | B1 | 5/2003 | Ahn et al. |
| 6,576,381 | B1 | 6/2003 | Hirano et al. |
| 6,578,754 | B1 | 6/2003 | Tung |
| 6,590,295 | B1 | 7/2003 | Liao et al. |
| 6,592,019 | B2 | 7/2003 | Tung |
| 6,599,778 | B2 | 7/2003 | Pogge et al. |
| 6,600,222 | B1 | 7/2003 | Levardo |
| 6,607,938 | B2 | 8/2003 | Kwon et al. |
| 6,639,303 | B2 | 10/2003 | Siniaguine |
| 6,661,085 | B2 | 12/2003 | Kellar et al. |
| 6,664,129 | B2 | 12/2003 | Siniaguine |
| 6,693,361 | B1 | 2/2004 | Siniaguine et al. |
| 6,731,003 | B2 | 5/2004 | Joshi et al. |
| 6,740,582 | B2 | 5/2004 | Siniaguine |
| 6,762,076 | B2 | 7/2004 | Kim et al. |
| 6,770,958 | B2 | 8/2004 | Wang et al. |
| 6,790,748 | B2 | 9/2004 | Kim et al. |
| 6,800,930 | B2 | 10/2004 | Jackson et al. |
| 6,818,545 | B2 | 11/2004 | Lee et al. |
| 6,828,677 | B2 | 12/2004 | Yap et al. |
| 6,841,883 | B1 | 1/2005 | Farnworth et al. |
| 6,853,076 | B2 | 2/2005 | Datta et al. |
| 6,869,831 | B2 | 3/2005 | Cowens et al. |
| 6,879,041 | B2 | 4/2005 | Yamamoto et al. |
| 6,882,030 | B2 | 4/2005 | Siniaguine |
| 6,887,769 | B2 | 5/2005 | Kellar et al. |
| 6,908,565 | B2 | 6/2005 | Kim et al. |
| 6,908,785 | B2 | 6/2005 | Kim |
| 6,917,119 | B2 | 7/2005 | Lee et al. |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,958,539 | B2 | 10/2005 | Lay et al. |
| 6,962,867 | B2 | 11/2005 | Jackson et al. |
| 6,962,872 | B2 | 11/2005 | Chudzik et al. |
| 6,975,016 | B2 | 12/2005 | Kellar et al. |
| 7,008,867 | B2 | 3/2006 | Lei |
| 7,012,333 | B2 | 3/2006 | Shimoyama et al. |
| 7,030,481 | B2 | 4/2006 | Chudzik et al. |
| 7,037,804 | B2 | 5/2006 | Kellar et al. |
| 7,049,170 | B2 | 5/2006 | Savastiouk et al. |
| 7,056,807 | B2 | 6/2006 | Kellar et al. |
| 7,060,601 | B2 | 6/2006 | Savastiouk et al. |
| 7,064,436 | B2 | 6/2006 | Ishiguri et al. |
| 7,071,546 | B2 | 7/2006 | Fey et al. |
| 7,087,538 | B2 | 8/2006 | Staines et al. |
| 7,111,149 | B2 | 9/2006 | Eilert |
| 7,122,912 | B2 | 10/2006 | Matsui |
| 7,151,009 | B2 | 12/2006 | Kim et al. |
| 7,157,787 | B2 | 1/2007 | Kim et al. |
| 7,193,308 | B2 | 3/2007 | Matsui |
| 7,215,033 | B2 | 5/2007 | Lee et al. |
| 7,262,495 | B2 | 8/2007 | Chen et al. |
| 7,271,497 | B2 | 9/2007 | Joshi et al. |
| 7,276,799 | B2 | 10/2007 | Lee et al. |
| 7,279,795 | B2 | 10/2007 | Periaman et al. |
| 7,297,574 | B2 | 11/2007 | Thomas et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,335,972 | B2 | 2/2008 | Chanchani |
| 7,345,350 | B2 | 3/2008 | Sinha |
| 7,348,210 | B2 | 3/2008 | Daubenspeck et al. |
| 7,355,273 | B2 | 4/2008 | Jackson et al. |
| 7,391,112 | B2 | 6/2008 | Li et al. |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,462,942 | B2 | 12/2008 | Tan et al. |
| 7,494,845 | B2 | 2/2009 | Hwang et al. |
| 7,501,311 | B2 | 3/2009 | Tsai |
| 7,524,755 | B2 | 4/2009 | Widodo et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,566,650 | B2 | 7/2009 | Lin et al. |
| 7,576,435 | B2 | 8/2009 | Chao |
| 7,592,246 | B2 | 9/2009 | Akram |
| 7,648,899 | B1 | 1/2010 | Banerji et al. |
| 7,825,511 | B2 | 11/2010 | Daubenspeck et al. |

(56) References Cited

U.S. PATENT DOCUMENTS

| | | |
|---|---|---|
| 7,834,450 B2 | 11/2010 | Kang |
| 7,928,534 B2 | 4/2011 | Hsu et al. |
| 2001/0000321 A1 | 4/2001 | Takeda et al. |
| 2002/0014705 A1 | 2/2002 | Ishio et al. |
| 2002/0033531 A1 | 3/2002 | Matsushima et al. |
| 2003/0156969 A1 | 8/2003 | Choi et al. |
| 2003/0216025 A1 | 11/2003 | Lu et al. |
| 2004/0094842 A1* | 5/2004 | Jimarez et al. ............... 257/772 |
| 2004/0166661 A1 | 8/2004 | Lei |
| 2005/0001324 A1 | 1/2005 | Dunn et al. |
| 2005/0026413 A1 | 2/2005 | Lee et al. |
| 2005/0077624 A1 | 4/2005 | Tan et al. |
| 2005/0179131 A1 | 8/2005 | Homma |
| 2005/0275098 A1* | 12/2005 | Wu ............................... 257/737 |
| 2006/0017160 A1 | 1/2006 | Huang |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1 | 12/2006 | Solo De Zaldivar |
| 2007/0023904 A1 | 2/2007 | Salmon |
| 2007/0080451 A1 | 4/2007 | Suh |
| 2007/0102815 A1* | 5/2007 | Kaufmann ............. H01L 24/11 257/737 |
| 2007/0108606 A1 | 5/2007 | Watanabe |
| 2007/0231957 A1 | 10/2007 | Mitsuhashi |
| 2007/0284684 A1 | 12/2007 | Naito et al. |
| 2007/0287279 A1 | 12/2007 | Daubenspeck et al. |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0166857 A1* | 7/2009 | Lee ............................... 257/737 |
| 2009/0197114 A1 | 8/2009 | Shih et al. |
| 2009/0229857 A1 | 9/2009 | Fredenberg et al. |
| 2010/0052162 A1* | 3/2010 | Iijima .......................... 257/737 |
| 2010/0090318 A1 | 4/2010 | Hsu et al. |
| 2010/0109159 A1 | 5/2010 | Ho et al. |
| 2010/0230810 A1 | 9/2010 | Kang et al. |
| 2011/0101523 A1 | 5/2011 | Hwang et al. |
| 2011/0101526 A1* | 5/2011 | Hsiao ............... H01L 23/49816 257/738 |
| 2011/0156256 A1 | 6/2011 | Kang et al. |
| 2011/0163441 A1* | 7/2011 | Bachman ............... H01L 24/11 257/737 |
| 2011/0195223 A1* | 8/2011 | Bchir .................... H01L 21/481 428/138 |
| 2011/0215458 A1* | 9/2011 | Camacho et al. ............. 257/686 |
| 2011/0227216 A1 | 9/2011 | Tseng et al. |
| 2011/0281432 A1 | 11/2011 | Farooq et al. |

FOREIGN PATENT DOCUMENTS

| | | |
|---|---|---|
| JP | 1993335313 | 12/1993 |
| JP | 2000228420 | 8/2000 |
| JP | 2004-296497 | 10/2004 |
| JP | 2009-152423 | 7/2009 |
| TW | 200924090 | 6/2009 |

OTHER PUBLICATIONS

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

U.S. Appl. No. 61/258,414, filed Nov. 5, 2009, Chien Ling Hwang, et al.

U.S. Appl. No. 61/238,749, filed Sep. 1, 2009, Chung-Shi Liu.

U.S. Appl. No. 61/258,393, filed Nov. 5, 2009, Chien Ling Hwang, et al.

U.S. Appl. No. 61/230,012, filed Jul. 30, 2009, Chung-Shi Liu, et al.

Office Action dated Apr. 23, 2014 from corresponding application No. CN 201010529468.1.

Office Action dated Apr. 26, 2016 from corresponding No. TW 099135514.

Office Action dated Sep. 1, 2016 from corresponding No. TW 099135514.

\* cited by examiner

CU PILLAR BUMP WITH L-SHAPED NON-METAL SIDEWALL PROTECTION STRUCTURE

RELATED APPLICATIONS

The present application is related to co-pending U.S. filing Ser. No. 12/730,411 filed on Mar. 3, 2010, which is expressly incorporated by reference herein in their entirety.

TECHNICAL FIELD

The present disclosure relates to integrated circuit fabrication, and more particularly, to bump structures in an integrated circuit device.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals. Recently, copper pillar bump technology is proposed. Instead of using solder bump, the electronic component is connected to a substrate by means of copper pillar bump, which achieves finer pitch with minimum probability of bump bridging, reduces the capacitance load for the circuits and allows the electronic component to perform at higher frequencies.

Cu pillar bump flip-chip assembly has the following advantages: (1) better thermal/electric performance, (2) higher current carrying capacity, (3) better resistance to electromigration, thus longer bump life, (4) minimizing molding voids—more consistence gaps between Cu pillar bumps. Also, lower cost substrate is possible by using Cu-pillar controlled solder spreading, eliminating lead-free teardrop design. However, copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low-K dielectric layers or to the solder used to bond the copper pillars to the substrate. A sidewall protection layer is therefore needed to prevent copper oxidation, but the conventional method of processing the Cu pillar sidewall suffers from high process costs and interface delamination issues. Currently, an immersion tin (Sn) process is employed to provide a tin layer on the Cu pillar sidewalls, but there are still concerns regarding process costs, adhesion between Sn and underfill, and issues of solder wetting onto sidewalls, which is a challenge for fine pitch package technology in new generation.

DETAILED DESCRIPTION OF ILLUSTRATIVE EMBODIMENTS

Figure 1A:
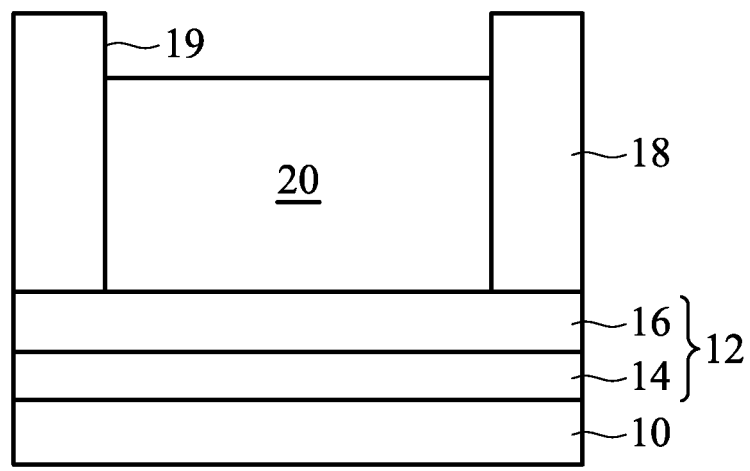
FIGS. 1A-1F are cross-sectional views depicting an exemplary embodiment of a portion of a semiconductor device at stages in a Cu pillar bump process.

This disclosure provides embodiments of sidewall protection processes for Cu pillar bump technology, in which an L-shaped protection structure on the sidewalls of the Cu pillar bump is formed of at least one of non-metal material layers, for example a dielectric material layer, a polymer material layer or combinations thereof. As employed throughout this disclosure, the term "Cu pillar bump" refers to a bump structure comprising a conductive pillar (a post or a standoff) formed of copper or copper alloys. The Cu pillar bump may be applied directly on an electrical pad or a redistribution layer on a semiconductor chip for a flip chip assembly or other similar application.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, FIGS. 1A~1F are cross-sectional views depicting an exemplary embodiment of a portion of a semiconductor device at stages in a Cu pillar bump process.

With reference to FIG. 1A, an example of a semiconductor substrate 10 used for bump fabrication is employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A pad region (not shown) is a top metallization layer formed in a top-level inter-layer dielectric layer, which is a portion of conductive routs and has an exposed surface treated by a planarization process, such as chemical mechanical polishing (CMP), if necessary. Suitable materials for the pad region may include, but are not limited to, for example copper (Cu), aluminum (Al), AlCu, copper alloy, or other mobile conductive materials. The pad region is used in the bonding process to connect the integrated circuits in the respective chip to external features.

The substrate 10 further includes a passivation layer (not shown) formed overlying and exposing a portion of the pad region for allowing subsequent Cu pillar bump processes. The passivation layer is formed of a non-organic material selected from un-doped silicate glass (USG), silicon nitride, silicon oxynitride, silicon oxide, and combinations thereof. Alternatively, the passivation layer is formed of a polymer layer, such as an epoxy, polyimide, benzocyclobutene (BCB), polybenzoxazole (PBO), and the like, although other relatively soft, often organic, dielectric materials can also be used.

Referring to FIG. 1A, the formation of an under-bump-metallurgy (UBM) layer 12 including a first UBM layer 14 and a second UBM layer 16 is performed on the substrate 10. For example, the UBM layer 12 is formed on the exposed portion of the pad region, and extends to a portion of the passivation layer. The first UBM layer 14, also referred to as a diffusion barrier layer or a glue layer, is formed of titanium, tantalum, titanium nitride, tantalum nitride, or the like by physical vapor deposition (PVD) or sputtering. The first UBM layer 14 is deposited to a thickness of between about 500 and 2000 angstrom, for example, to a thickness of about 1000 Angstrom. The second UBM layer 16 is a copper seed layer formed on the first UBM layer 14 by physical vapor deposition (PVD) or sputtering. The second UBM layer 16 may be formed of copper alloys that include silver, chromium, nickel, tin, gold, and combinations thereof. The second UBM layer 16 is deposited to a thickness of between about 500 and 10000 angstrom, for example, to a thickness of about 5000 Angstrom. In one embodiment, the UBM layer 12 includes a first UBM layer 14 formed of Ti and a second UBM layer 16 formed of Cu.

Next, a mask layer 18 is provided on the UBM layer 12 and patterned with an opening 19 exposing a portion of the UBM layer 12 for Cu pillar bump formation. The mask layer 18 may be a dry film or a photoresist film. The opening 19 is then partially or fully filled with a conductive material with solder wettability. In an embodiment, a copper (Cu) layer 20 is formed in the opening 19 to contact the underlying UBM layer 12. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 20. In an exemplary embodiment, the thickness of the Cu layer 20 is greater than 25 um. In another exemplary embodiment, the thickness of the Cu layer 20 is greater than 40 um. For example, the Cu layer 20 is of about 40~50 um thickness, about 45 um thickness, or about 40~70 µm thickness, although the thickness may be greater or smaller.

Figure 1B:
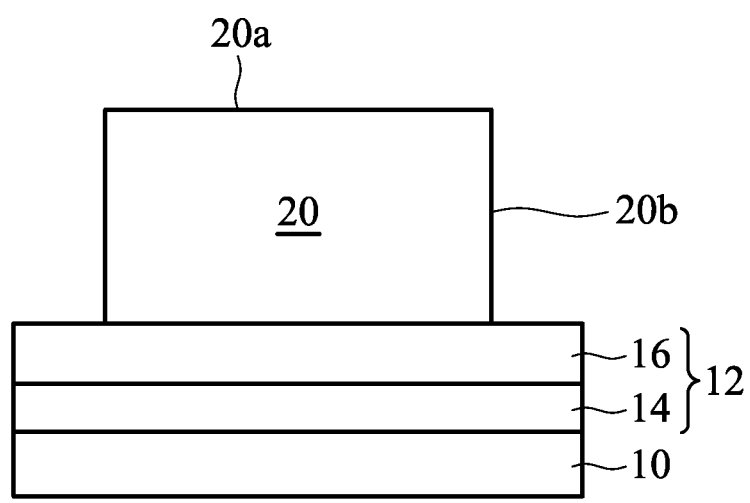

With reference to FIG. 1B, the mask layer 18 is removed, exposing the top surface 20a and sidewall surfaces 20b of the Cu layer 20 and a portion of the UBM layer 12 outside the Cu layer 20. The Cu layer 20 is referred to as a Cu pillar 20 hereinafter. In the case the mask layer 18 is a dry film, it may be removed using an alkaline solution. If the mask layer 18 is formed of photoresist, it may be removed using acetone, n-methyl pyrrolidone (NMP), dimethyl sulfoxide (DMSO), aminoethoxy ethanol, and the like.

Figure 1C:
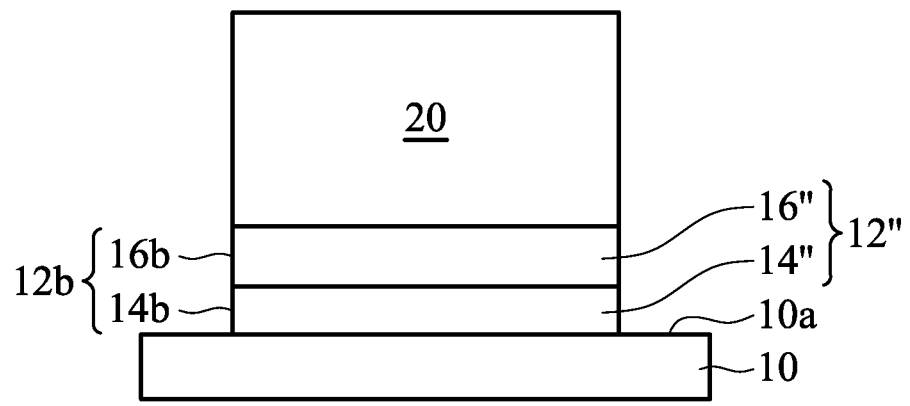

Then as shown in FIG. 1C, using the Cu pillar 20 as a mask, the exposed portion of the UBM layer 12 is etched to expose a surface region 10a of the underlying substrate 10. In an exemplary embodiment, the step of etching the UBM layer 12 is a dry etching or a wet etching. For example, an isotropic wet etching (often referred to as flash etching due to its short duration) using an ammonia-based acid is employed, or a dry etching process, such as standard RIE procedure is employed. Thus, underlying the Cu pillar 20, the patterned UBM layer 12" has exposed sidewall surfaces 12b. In detail, the patterned second UBM layer 16" has sidewall surfaces 16b, and the patterned first UBM layer 14" has sidewall surfaces 14b.

Figure 1D:
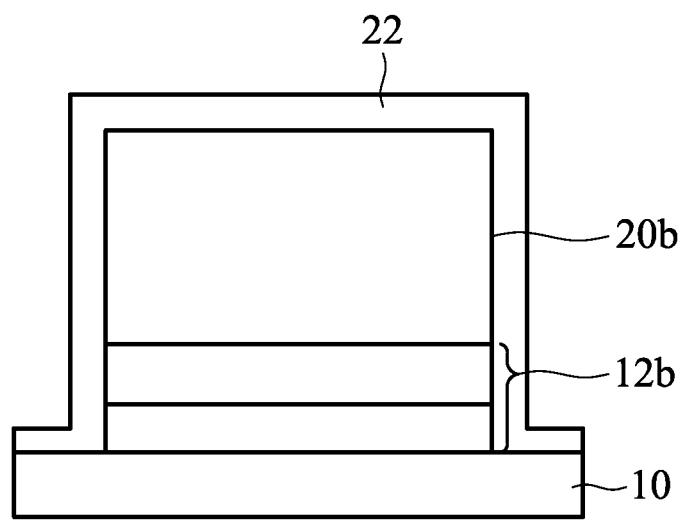

With reference to FIG. 1D, a protection layer 22 is formed on the resulted structure, for example by a blanket deposition. In detail, the protection layer 22 is deposited to cover the top surface 20a and the sidewall surfaces 20b of the Cu pillar 20, the sidewall surfaces 12b of the patterned UBM layer 12". The protection layer 22 is a non-metal material layer, for example a dielectric material layer, a polymer material layer or combinations thereof. The protection layer 22 may be a single material layer, or a multi-layered structure. The protection layer 22 is between about 500 Angstroms to about 10000 Angstroms thick. In one embodiment, the protection layer 22 is a dielectric material layer formed of silicon nitride, silicon oxide, silicon oxynitride, silicon carbide, alternating layers of silicon oxide and silicon nitride, or combinations thereof by using any of a variety of deposition techniques, including thermal oxidation, LPCVD (low-pressure chemical vapor deposition), APCVD (atmospheric-pressure chemical vapor deposition), PECVD (plasma-enhanced chemical vapor deposition) and future-developed deposition procedures. In another embodiment, the protection layer 22 is a polymer material layer, as the name suggests, is formed of a polymer, such as an epoxy, polyimide, benzocyclobutene (BCB), polybenzoxazole (PBO), and the like, although other relatively soft, often organic, dielectric materials can also be used. The polymer material layer is soft, and hence has the function of reducing inherent stresses on respective substrate. In addition, the polymer layer is easily formed to thickness of tens of microns.

Figure 1E:
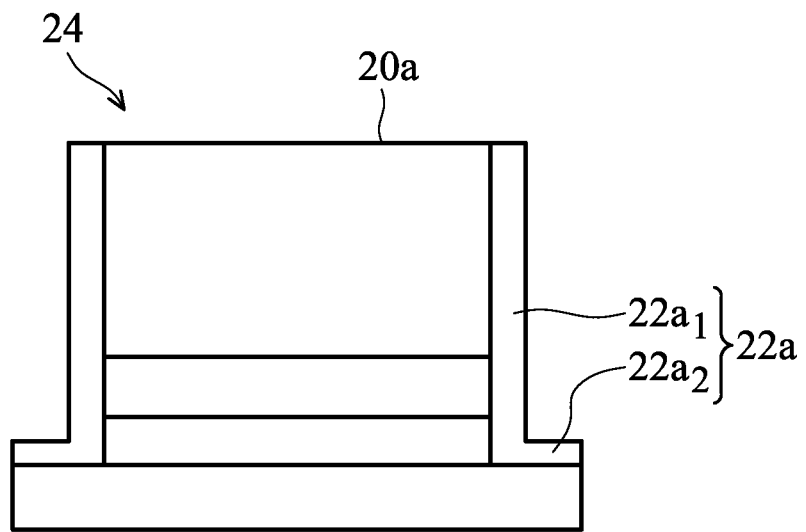

Next, referring to FIG. 1E, a region of the protection layer 22 are removed from the top surface 20a of the Cu pillar 20 through a chemical mechanical polishing (CMP) process, thereby leaving resulting L-shaped sidewall spacers 22a. The L-shaped sidewall spacer 22a lines the sidewall surfaces 20b and 12b and extends to the adjacent surface region 10a of the substrate 10. The L-shaped sidewall spacer 22a includes a first portion 22$a_1$ along sidewall surfaces 20b and 12b, and a second portion 22$a_2$ along the surface region 10a. The upper surfaces of the L-shaped sidewall spacer 22a are substantially coplanar with the top surface 20a of the Cu pillar 20. The L-shaped sidewall spacer 22a is also referred to as a sidewall protection structure 22a hereinafter. Advances in lithography and masking techniques and dry etch processes, such as RIE (Reactive Ion Etching) and other plasma etching processes, allow production of the sidewall protection structure. The completed bump structure 24 includes the Cu pillar 20 and the patterned UBM layer 12". The L-shaped sidewall spacer 22a covers the sidewall surfaces 20b and 12b and the adjacent surface region 10a.

Figure 1F:
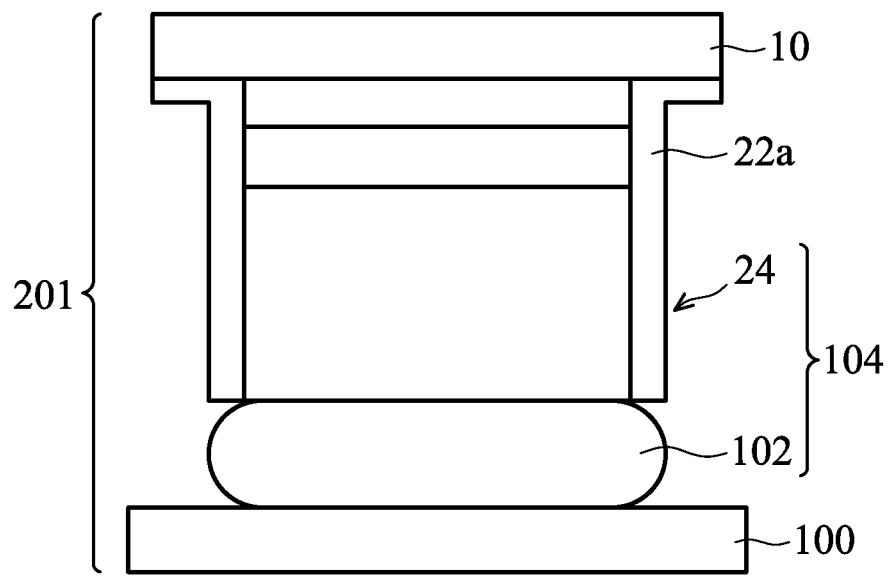

The substrate 10 is then sawed and packaged onto a package substrate, or another die, with solder balls or Cu bumps mounted on a pad on the package substrate or the other die. FIG. 1F is a cross-sectional diagram depicting an exemplary embodiment of a flip-chip assembly. The structure shown in FIG. 1E is flipped upside down and attached to another substrate 100 at the bottom. The substrate 100 may be a package substrate, board (e.g., a printed circuit board (PCB)), or other suitable substrate. The bump structure 24 contacts the substrate 100 at various conductive attachment points, for example, a joint solder layer 102 on contact pads and/or conductive traces, forming a joint structure 104 coupling the two substrates 10 and 100. The joint solder layer 102 may be a eutectic solder material including alloys of tin, lead, silver, copper, nickel, bismuth, or combinations thereof. An exemplary coupling process includes a flux application, chip placement, reflowing of melting solder joints, and cleaning of flux residue. The integrated circuit substrate 10, the joint structure 104, and the other substrate 100 may be referred to as a packaging assembly 201, or in the present embodiment, a flip-chip packaging assembly.

The disclosure provides an L-shaped sidewall protection structure formed of a non-metal material on the Cu pillar sidewall to prevent the Cu pillar sidewall from oxidation and increase adhesion between the Cu pillar sidewall and a subsequently formed underfill material. Compared with the conventional immersion Sn method followed by an annealing process, the non-metal sidewall protection structure can adjust substrate stress, prevent solder wetting to the Cu pillar around the perimeter of the UBM layer during the reflow process, and eliminate blue tape residue. This is applicable to fine pitch bump schemes.

FIGS. 2A~2E are cross-sectional views depicting another exemplary embodiment of a portion of a semiconductor device at stages in a Cu pillar bump process, while explanation of the same or similar portions to the description in FIGS. 1A to 1F will be omitted.

Figure 2A:
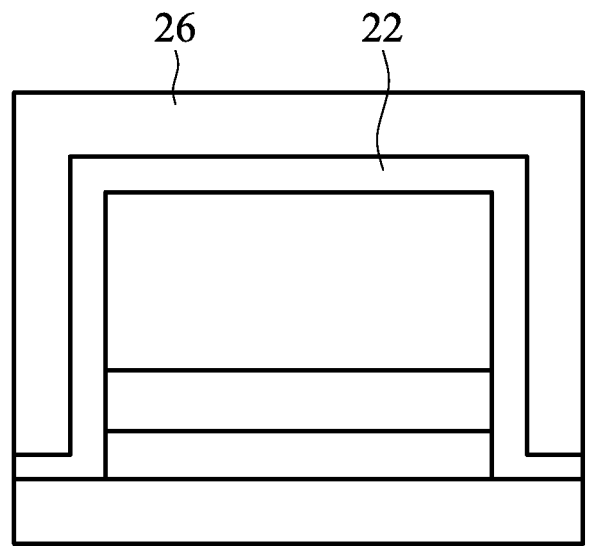
FIGS. 2A~2E are cross-sectional views depicting an exemplary embodiment of a portion of a semiconductor device at stages in a Cu pillar bump process.
Figure 2B:
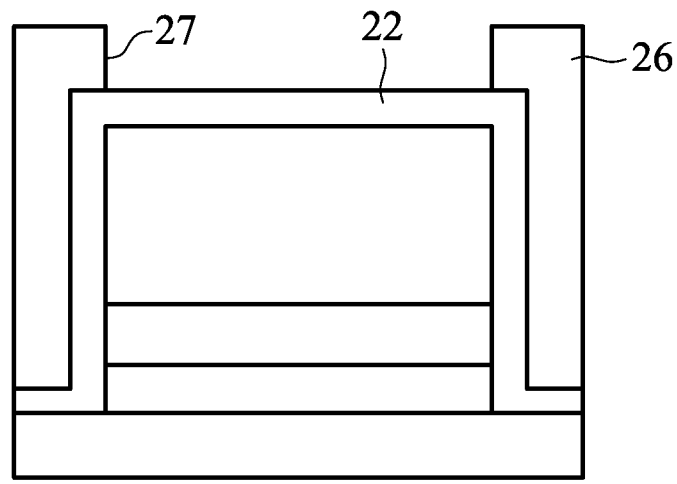
Figure 2C:
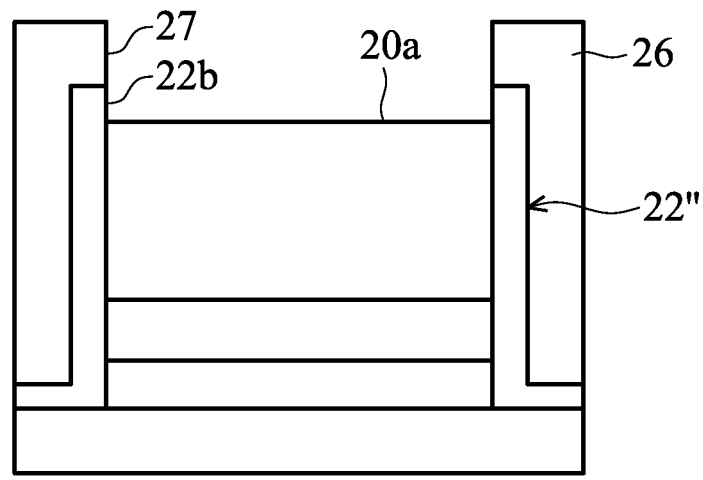

With reference to FIG. 2A, after depositing the protection layer 22 on the Cu pillar 20, the patterned UBM layer 12" and the adjacent surface region 10a of the substrate 10, a photoresist layer 26 is coated on the protection layer 22. Then as depicted in FIG. 2B, the photoresist layer 26 is patterned by laser exposure, bake, developing, and/or other photolithography processes known in the art to provide an opening 27 exposing a portion of the protection layer 22 positioned over the top surface 20a of the Cu pillar 20. The exposed portion of the protection layer 22 is then etched, by a wet etch or dry etch process, using the patterned photoresist layer as a masking element to provide an opening 22b in the protection layer 22, thereby exposing the top surface 20a of the Cu pillar 20 as depicted in FIG. 2C.

Figure 2D:
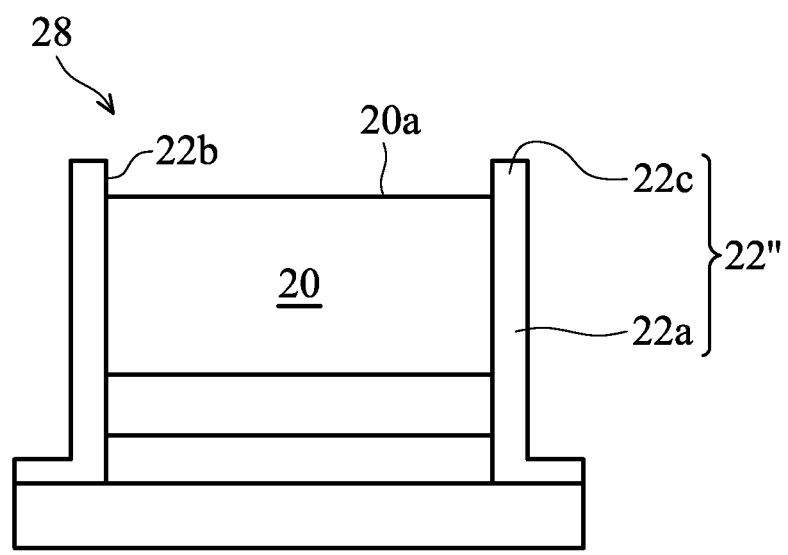

With reference to FIG. 2D, the photoresist layer 26 is removed, leaving resulting an elongated sidewall protection structure 22" that includes the L-shaped sidewall spacer 22a and a protrusion 22c extending from the upper surface of the L-shaped sidewall spacer 22a. That is, elongated sidewall protection structure 22" has an upper surface higher than the top surface 20a of the Cu pillar 20. The completed bump structure 28 includes the Cu pillar 20 and the patterned UBM layer 12". The elongated sidewall protection structure 22" covers the sidewall surfaces 20b and 12b and the surface region 10a.

Figure 2E:
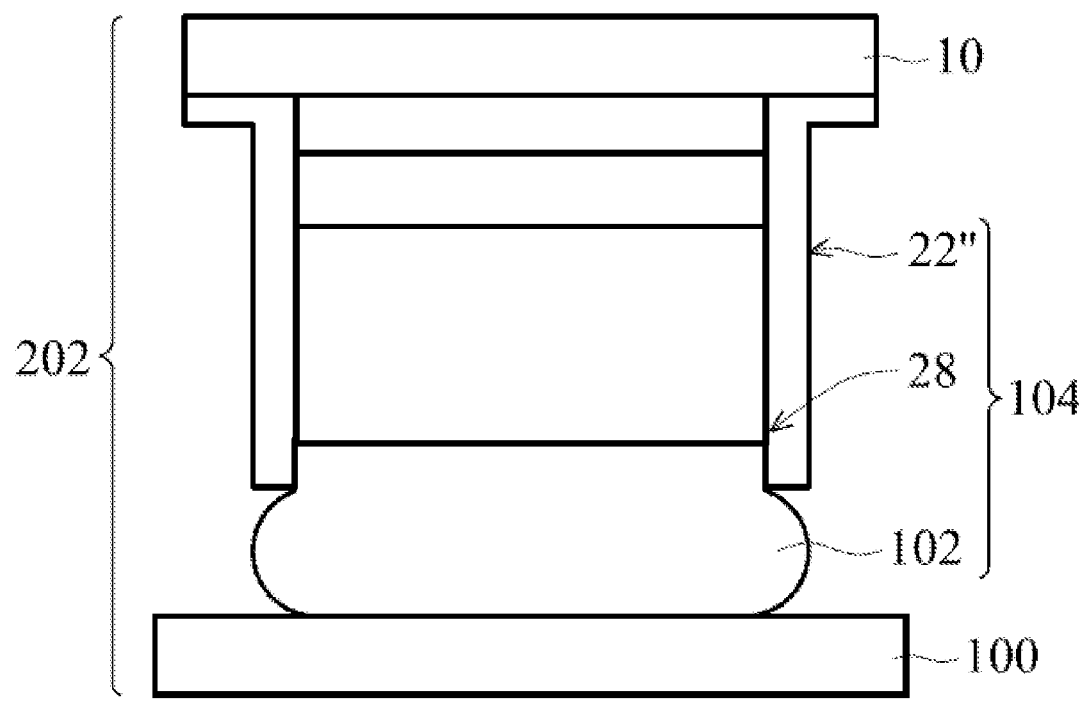

Referring to FIG. 2E, the substrate 10 is flipped upside down and attached to another substrate 100 at the bottom. The bump structure 28 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 202, or in the present embodiment, a flip-chip packaging assembly.

FIGS. 3A~3G are cross-sectional views depicting another exemplary embodiment of a portion of a semiconductor device at stages in a Cu pillar bump process, while explanation of the same or similar portions to the description in FIGS. 1A to 1F will be omitted.

Figure 3A:
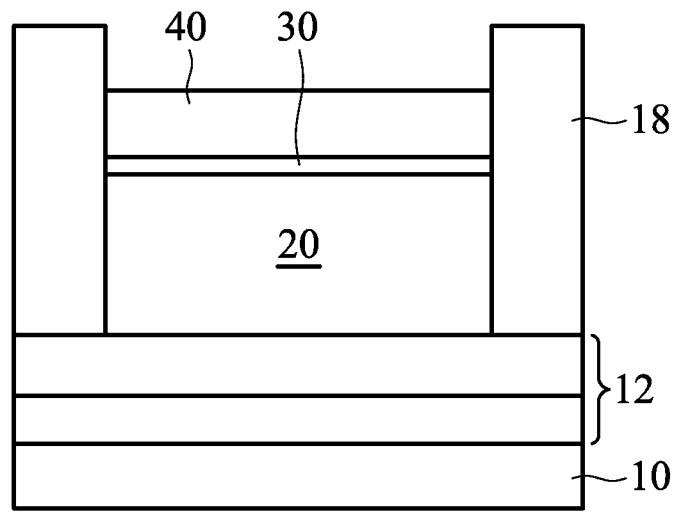
FIGS. 3A~3G are cross-sectional views depicting an exemplary embodiment of a portion of a semiconductor device at stages in a Cu pillar bump process.

With reference to FIG. 3A, after forming the Cu layer 20 in the opening 19 of the mask layer 18, a cap layer 30 is formed on the top surface 20a of the Cu layer 20. The cap layer 30 could act as a barrier layer to prevent copper in the Cu pillar from diffusing into bonding material, such as solder alloy, that is used to bond the substrate 10 to external features. The prevention of copper diffusion increases the reliability and bonding strength of the package. The cap layer 30 may include nickel (Ni), tin, tin-lead (SnPb), gold (Au), silver, palladium (Pd), In, nickel-palladium-gold (NiPdAu), nickel-gold (NiAu), other similar materials, or alloy by plating methods. The cap layer 30 has a thickness about 1~10 um. In some embodiments, the cap layer 30 is a multi-layers structure including Ni, Au, Pd, Ni-base alloy, Au-base alloy, or Pd-base alloy.

Then a solder layer 40 is formed on the cap layer 30. The solder layer 40 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In one embodiment, the solder layer 40 is a lead-free solder layer. For a lead-free solder system, the solder layer is SnAg with Ag content being controlled lower than 3.0 weight percent (wt %). For example, the lead-free solder layer is SnAg with Ag content being controlled at about 2.5 weight percent (wt %).

Figure 3B:
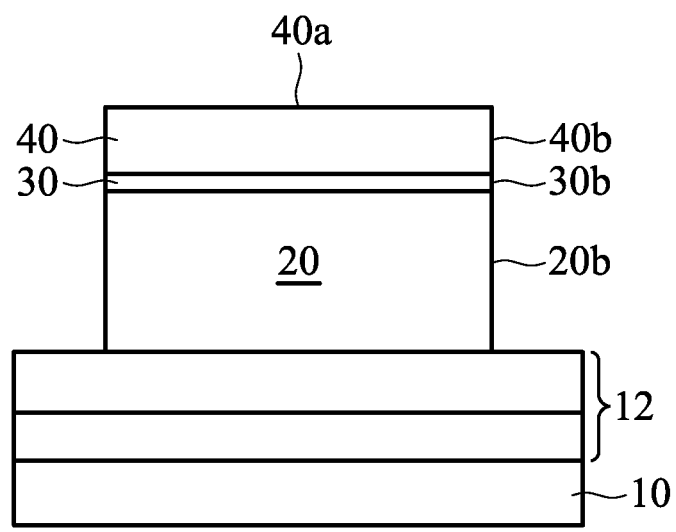
Figure 3C:
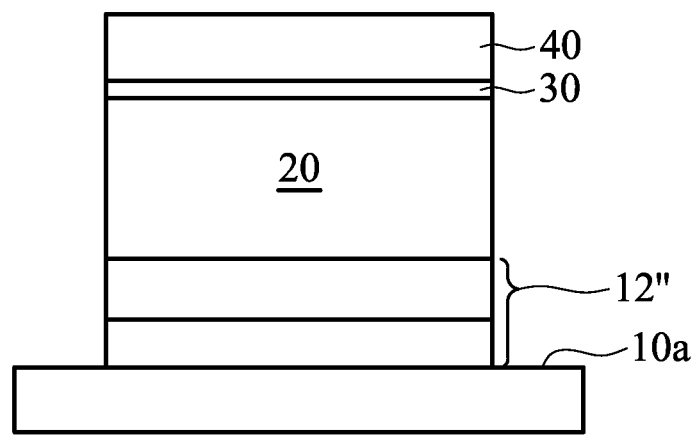
Figure 3D:
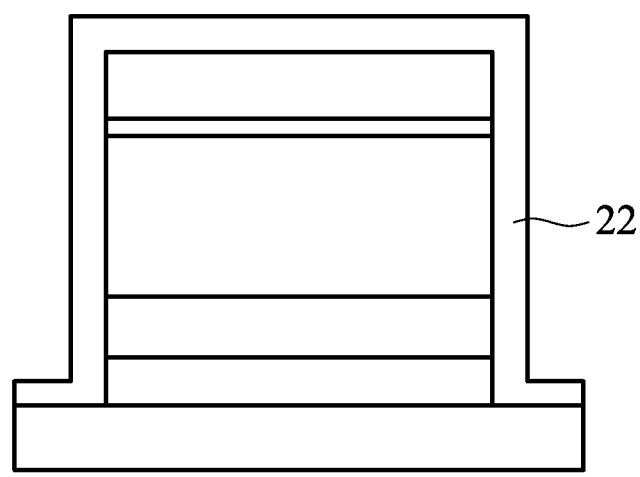
Figure 3E:
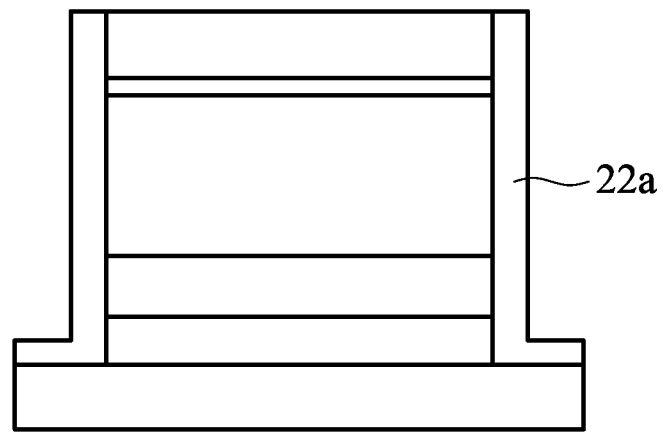

Next, as shown in FIG. 3B, the mask layer 18 is removed, and the top surface 40a and sidewall surfaces 40b of the solder layer and the sidewall surfaces 30b of the cap layer 30 are exposed. Then the exposed portion of the UBM layer 12 is etched as shown in FIG. 3C, exposing the underlying surface region 10a outside the Cu pillar 20. Thereafter, as depicted in FIG. 3D, a protection layer 22 is formed to cover the resulted structure. After performing a CMP process, an L-shaped sidewall spacer 22a is created as depicted in FIG. 3E. The top surface 40a of the solder layer 40 is therefore exposed. The upper surfaces of the L-shaped sidewall spacer 22a are substantially coplanar with the top surface 40a of the solder layer 40.

Figure 3F:
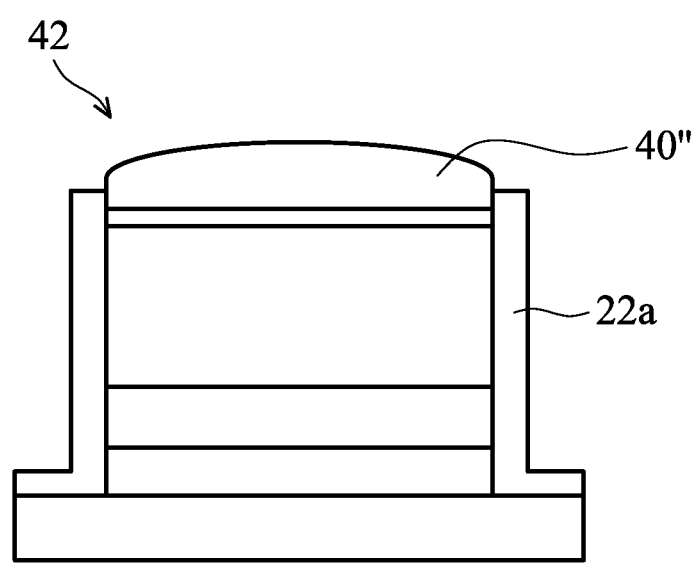

With reference to FIG. 3F, a reflowing process is performed on the solder layer 40 to form a reflowed solder layer 40" on the cap layer 30. This completes a bump structure 42 that includes the Cu pillar 20, the cap layer 30 on the Cu pillar 20, the reflowed solder layer 40" on the cap layer 30 and the patterned UBM layer 12" underlying the Cu pillar 20. The L-shaped sidewall spacer 22a covers the sidewall surfaces 40b, 30b, 20b and 12b and the surface region 10a.

Figure 3G:
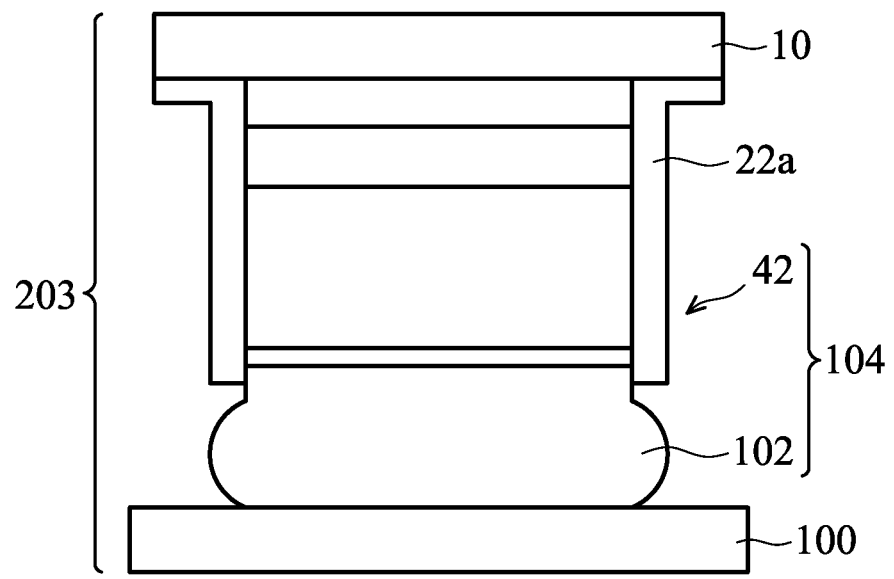

The substrate 10 is then sawed and packaged onto a package substrate, or another die, with solder balls or Cu bumps mounted on a pad on the package substrate or the other die. Referring to FIG. 3G, the substrate 10 is flipped upside down and attached to another substrate 100 at the bottom. The bump structure 42 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 203, or in the present embodiment, a flip-chip packaging assembly.

FIGS. 4A-4E are cross-sectional views depicting another exemplary embodiment of a portion of a semiconductor device at stages in a Cu pillar bump process, while explanation of the same or similar portions to the description in FIGS. 3A to 3G will be omitted.

Figure 4A:
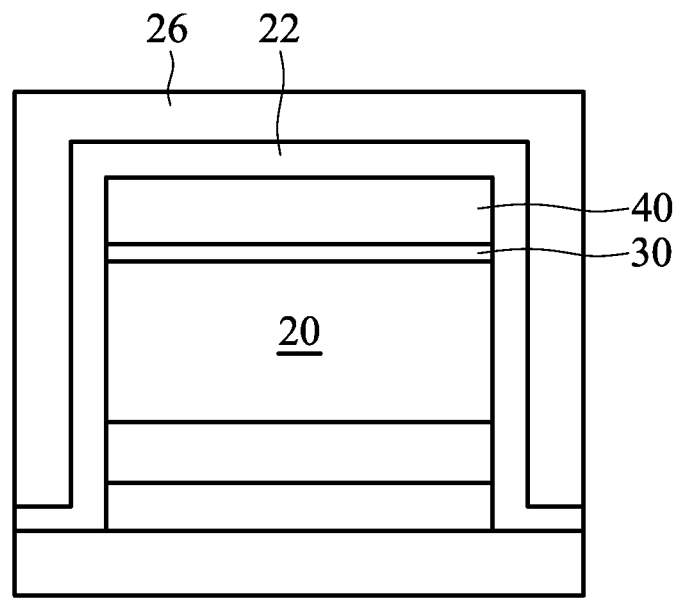
FIGS. 4A~4E are cross-sectional views depicting an exemplary embodiment of a portion of a semiconductor device at stages in a Cu pillar bump process.
Figure 4B:
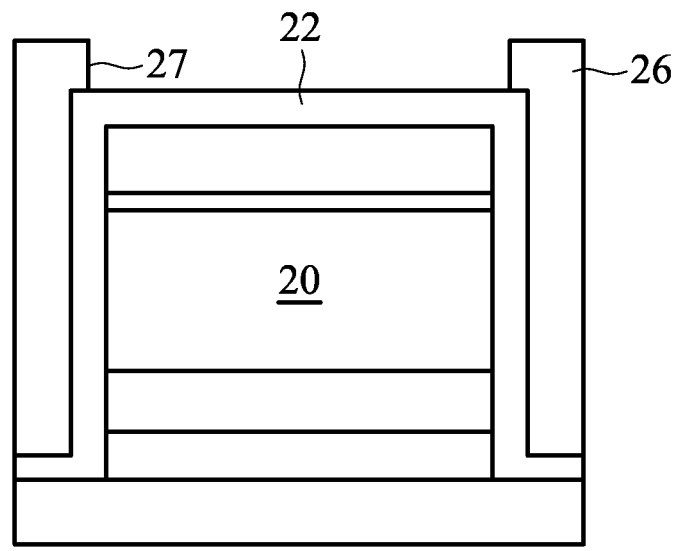
Figure 4C:
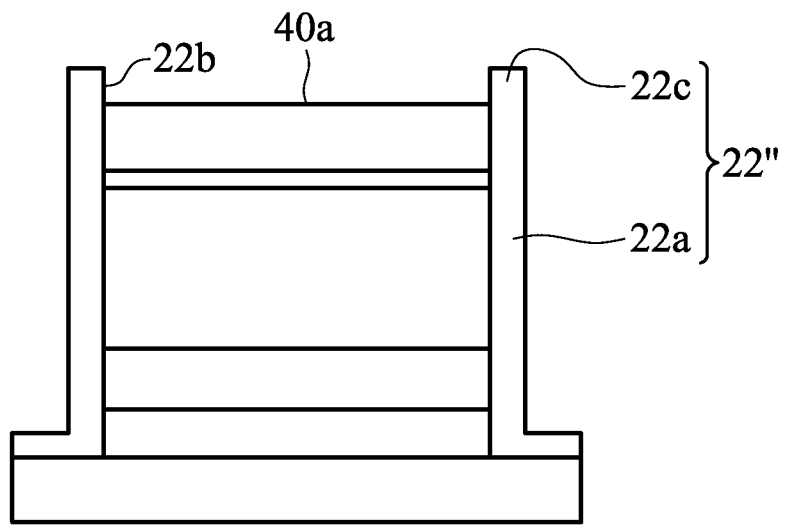

With reference to FIG. 4A, after depositing the protection layer 22 on the resulted structure, a photoresist layer 26 is coated on the protection layer 22. Then as depicted in FIG. 4B, the photoresist layer 26 is patterned by laser exposure, bake, developing, and/or other photolithography processes known in the art to provide an opening 27 exposing a portion of the protection layer 22 positioned over the top surface 40a of the solder layer 40. The exposed portion of the protection layer 22 is then etched, by a wet etch or dry etch process, using the patterned photoresist layer as a masking element to provide an opening 22b in the protection layer 22, thereby exposing the top surface 40a of the solder layer 40, as depicted in FIG. 4C. The photoresist layer 26 is then removed, resulting an elongated sidewall protection structure 22" that includes the L-shaped sidewall spacer 22a and a protrusion 22c extending from the upper surface of the L-shaped sidewall spacer 22a. That is, elongated sidewall protection structure 22" has an upper surface higher than the top surface 40a of the solder layer 40.

Figure 4D:
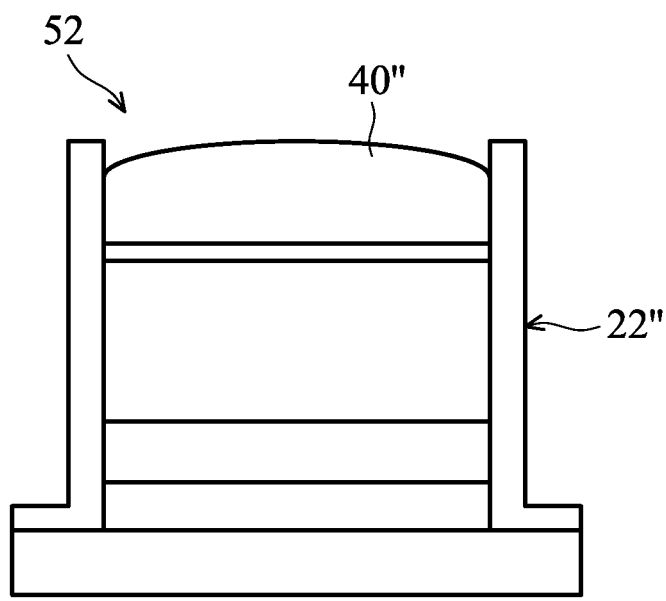

With reference to FIG. 4D, a reflowing process is performed on the solder layer 40 to form a reflowed solder layer 40" on the cap layer 30. This completes a bump structure 52 that includes the Cu pillar 20, the cap layer 30 on the Cu pillar 20, the reflowed solder layer 40" on the cap layer 30, and the patterned UBM layer 12" underlying the Cu pillar 20. The elongated L-shaped sidewall spacer 22" covers the sidewall surfaces 40b, 30b, 20b and 12b and the surface region 10a. The upper surface of the elongated sidewall protection structure 22" is greater than not only the top surface 20a of the Cu pillar 20, but also the top surface 30a of the cap layer 30. The upper surface of the elongated sidewall protection structure 22" may be equal to or higher than the top surface 40a of the solder layer 40 depending on the volume of the solder layer 40 and the reflow process control.

Figure 4E:
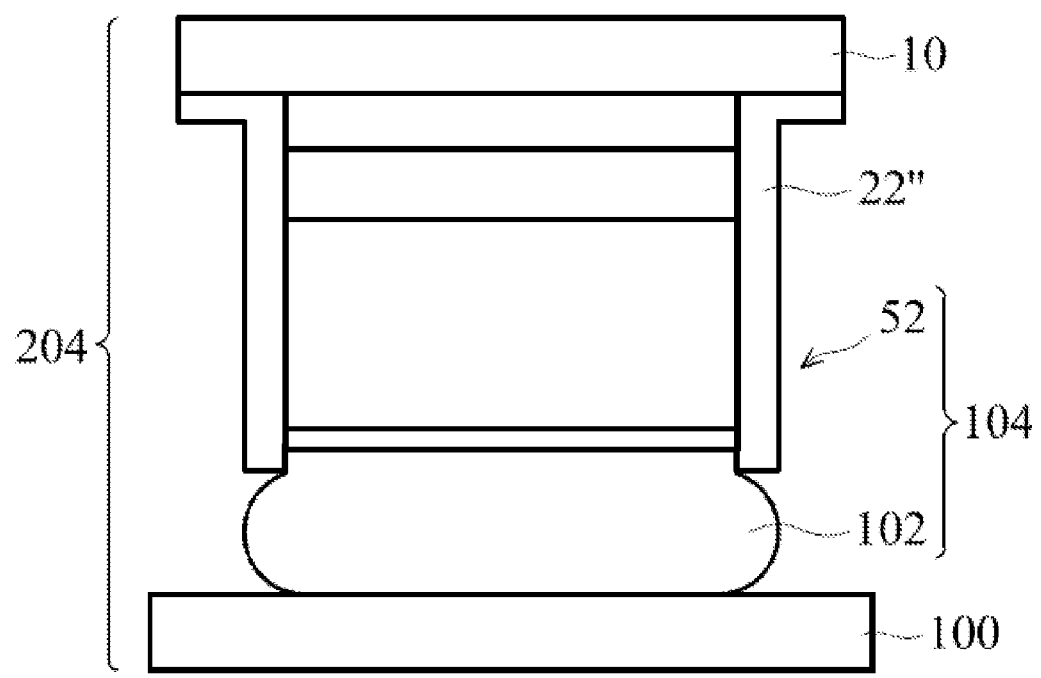

Referring to FIG. 4E, the substrate 10 is flipped upside down and attached to another substrate 100 at the bottom. The bump structure 58 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 204, or in the present embodiment, a flip-chip packaging assembly.

In the preceding detailed description, the disclosure is described with reference to specific exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. An integrated circuit device, comprising:
    a bump structure formed on a semiconductor substrate, wherein the bump structure comprises a top surface and a sidewall surface, the bump structure further comprises a solder layer, and the semiconductor substrate comprises a surface region adjacent to the sidewall surface of the bump structure; and
    an L-shaped protection structure covering the sidewall surface of the bump structure and extending to the surface region of the semiconductor substrate,
    wherein the L-shaped protection structure is formed of a non-metal material layer, and the L-shaped protection structure has an upper surface that is higher than the top surface of the bump structure.

2. The integrated circuit device of claim 1, wherein the L-shaped protection structure comprises a silicon nitride layer.

3. The integrated circuit device of claim 1, wherein the L-shaped protection structure comprises a polyimide layer.

4. The integrated circuit device of claim 1, wherein the L-shaped protection structure comprises at least one of a dielectric layer, a polymer layer or combinations thereof.

5. The integrated circuit device of claim 1, wherein the bump structure comprises a conductive pillar.

6. The integrated circuit device of claim 5, wherein the conductive pillar is a copper pillar.

7. The integrated circuit device of claim 5, wherein the bump structure comprises a cap layer on the conductive pillar, and the cap layer is between the conductive pillar and the solder layer.

8. The integrated circuit device of claim 7, wherein the cap layer comprises a nickel layer.

9. A packaging assembly, comprising:
a first substrate;
a bump structure formed on the first substrate, wherein the bump structure comprises an under-bump-metallurgy (UBM) layer formed on the first substrate, a copper pillar formed on the UBM layer, and a solder layer on the copper pillar, and the bump structure has a sidewall surface adjacent to a surface region of the first substrate;
an L-shaped protection structure covering the sidewall surface of the bump structure and extending to the surface region of the first substrate, wherein the L-shaped protection structure is formed of a non-metal material layer,
a second substrate; and
a joint solder layer formed between the second substrate and the solder layer of the bump structure.

10. The packaging assembly of claim 9, wherein the L-shaped protection structure comprises at least one of a silicon nitride layer, a polyimide layer or combinations thereof.

11. The packaging assembly of claim 9, wherein the bump structure has a top surface substantially coplanar with an upper surface of the L-shaped protection.

12. The packaging assembly of claim 9, wherein the bump structure has a top surface lower than an upper surface of the L-shaped protection.

13. An integrated circuit device, comprising:
a bump structure formed on a substrate, wherein the bump structure comprises a first top surface and a first sidewall surface, and the substrate comprises a surface region adjacent to the sidewall surface of the bump structure;
a cap layer over the bump structure, the cap layer having a second top surface and a second sidewall surface; and
an L-shaped protection structure covering the first sidewall surface and the second sidewall surface, and extending along the surface region of the semiconductor substrate,
wherein the second top surface is lower than an upper surface of the L-shaped protection structure, and the L-shaped protection structure is formed of a non-metal material layer.

14. The integrated circuit device of claim 13, further comprising a solder layer over the cap layer, the solder layer having a third top surface and a third sidewall surface, wherein the L-shaped protection structure covers the third sidewall surface.

15. The integrated circuit device of claim 14, wherein the upper surface of the L-shaped protection structure is substantially coplanar with the third top surface.

16. The integrated circuit device of claim 14, wherein the third top surface is lower than the upper surface of the L-shaped protection structure.

17. The integrated circuit of claim 13, wherein the bump structure comprises:
at least one under bump metallurgy (UBM) layer over the substrate; and
a conductive pillar over the at least one UBM layer.

18. The integrated circuit of claim 13, wherein the cap layer has a thickness ranging from 1 micrometer (µm) to 10 µm.

19. The package assembly of claim 9, wherein the bump structure further comprises a cap layer between the copper pillar and the solder layer.

20. The integrated circuit of claim 1, wherein the bump structure further comprises an under bump metallurgy (UBM) layer, the UBM layer comprising:
a diffusion barrier layer on the semiconductor substrate; and
a seed layer over the diffusion barrier layer.

* * * * *